(12) United States Patent
Zha et al.

(10) Patent No.: US 9,417,536 B2
(45) Date of Patent: Aug. 16, 2016

(54) EXPOSURE APPARATUS AND EXPOSURE SYSTEM

(71) Applicants: BOE Technology Group Co., Ltd., Beijing (CN); Beijing BOE Display Technology Co., Ltd., Beijing (CN)

(72) Inventors: Changjun Zha, Beijing (CN); Min Li, Beijing (CN); Hongjiang Wu, Beijing (CN)

(73) Assignees: BOE Technology Group Co., Ltd., Beijing (CN); Beijing BOE Display Technology Co., Ltd., Beijing (CN)

( * ) Notice: Subject to any disclaimer, the term of this patent is extended or adjusted under 35 U.S.C. 154(b) by 190 days.

(21) Appl. No.: 14/339,608

(22) Filed: Jul. 24, 2014

(65) Prior Publication Data

US 2015/0253681 A1    Sep. 10, 2015

(30) Foreign Application Priority Data

Mar. 6, 2014   (CN) .......................... 2014 1 0081021

(51) Int. Cl.
  *G03B 27/58* (2006.01)
  *G03F 7/20* (2006.01)

(52) U.S. Cl.
  CPC .............. *G03F 7/7035* (2013.01); *G03F 7/707* (2013.01); *G03F 7/70783* (2013.01); *G03F 7/70791* (2013.01)

(58) Field of Classification Search
  CPC ... G03F 7/7035; G03F 7/707; G03F 7/70783; G03F 7/70791
  USPC .......................................................... 355/72
  See application file for complete search history.

(56) References Cited

U.S. PATENT DOCUMENTS

| 5,563,684 A * | 10/1996 | Stagaman .............. G03B 27/58 355/47 |
| 5,634,708 A | 6/1997 | Koie et al. |
| 2007/0072128 A1 * | 3/2007 | Miceli ................. H01L 21/0274 430/311 |

FOREIGN PATENT DOCUMENTS

| EP | 0 633 505 A1 | 1/1995 |
| JP | 04-149555 | 5/1992 |
| TW | 200300960 A | 12/2001 |

OTHER PUBLICATIONS

First Chinese Office Action for Chinese Patent Application No. 201410081021.0, dated Apr. 23, 2015, 10 pages.

* cited by examiner

*Primary Examiner* — Peter B Kim

(74) *Attorney, Agent, or Firm* — Westman, Champlin & Koehler, P.A.

(57) ABSTRACT

An exposure apparatus is provided. It comprises: a substrate stage on which a holding region is provided to hold a substrate to be exposed, the holding region being provided with a support portion thereon for supporting the substrate to be exposed; a supporter configured to support a mask; a light source system configured to provide an exposure light which is illuminated on the substrate to be exposed via the mask to reproduce a pattern of the mask onto the substrate, wherein the support portion has a height which decreases gradually from an outer periphery of the holding region to a center of the holding region, such that an exposure distance is constant at all of positions on the holding region. With the above structure, the graph dimension may be kept uniform on the substrate even if the mask becomes bent.

6 Claims, 2 Drawing Sheets

EXPOSURE APPARATUS AND EXPOSURE SYSTEM

CROSS-REFERENCE TO RELATED APPLICATION

This application claims the benefit of Chinese Patent Application No, 201410081021.0 filed on Mar. 6, 2014 in the State Intellectual Property Office of China, the whole disclosure of which is incorporated herein by reference.

BACKGROUND OF THE INVENTION

1. Field of the Invention

The present disclosure relates to an exposure technique, more particularly, relates to an exposure apparatus and an exposure system.

2. Description of the Related Art

As the panel display technique develops, a liquid crystal display has been applied widely in various devices, such as a computer, TV, a cell phone and a camera. Large dimension, high resolution and high quality have become a trend in the development of the liquid crystal display more and more. Large dimensional display products promote the development of high generation lines. Thus, the dimension of the mask of the exposure apparatus during processing of a substrate also becomes larger. It causes bending of the mask to become more and more apparent such that the problem that graphs formed on a color filter by performing a lithographic process with the mask have non-uniform dimensions becomes more and more severe and thus the quality of products may be degraded. Typically, the exposure apparatus is a proximity exposure apparatus.

The proximity exposure apparatus typically comprises a light source, an alignment system, a mask holder, a stage, a robot or the like. FIG. 1 is a schematic view showing a proximity exposure in a typical process for producing color filters. The proximity exposure apparatus as shown comprises a substrate stage 1, supporting legs 2, a glass substrate 3, a photo resist 4 and a mask 5. A distance between the mask 5 and the glass substrate 3 is in a range of several hundred micrometers. All of the supporting legs 2 have an identical height. During exposure, the large dimensional mask may be bent to some extent such that the distance between the mask 5 and the glass substrate 3 varies among various positions. In particular, an exposure distance at a central part of the glass substrate 3 is less than that at its edge part (i.e., G2<G1). Since the graph dimensions (CD) formed by exposing the photo resist material vary with the exposure distance in the proximity exposure, the graph dimension produced on the substrate are different, in particular, the graph dimension at the central part is less than that at the edge part (CD2<CD1), which degrades the quality of the display product.

SUMMARY OF THE INVENTION

According to an aspect of the present disclosure, there is provided an exposure apparatus comprising:

a substrate stage on which a holding region is provided to hold a substrate to be exposed, the holding region being provided thereon with a support portion for supporting the substrate to be exposed;

a supporter configured to support a mask;

a light source system configured to provide an exposure light which is illuminated on the substrate to be exposed via the mask to reproduce a pattern of the mask onto the substrate, wherein the support portion has a height which decreases gradually from an outer periphery of the holding region to a center of the holding region, such that an exposure distance is constant at all of positions on the holding region.

According to another aspect of the present disclosure, there is provided an exposure system comprising a mask and an exposure apparatus, the exposure apparatus comprising:

a substrate stage on which a holding region is provided to hold a substrate to be exposed, the holding region being provided with a support portion thereon for supporting the substrate to be exposed;

a supporter configured to support a mask;

a light source system configured to provide an exposure light which is illuminated on the substrate to be exposed via the mask to reproduce a pattern of the mask onto the substrate, wherein the support portion has a height which decrease gradually from an outer periphery of the holding region to a center of the holding region, such that an exposure distance is constant at all of positions on the holding region.

BRIEF DESCRIPTION OF THE DRAWINGS

The above and other features of the present invention will become more apparent by describing in detail exemplary embodiments thereof with reference to the accompanying drawings, in which.

REFERENCE NUMERALS

Figure 1:
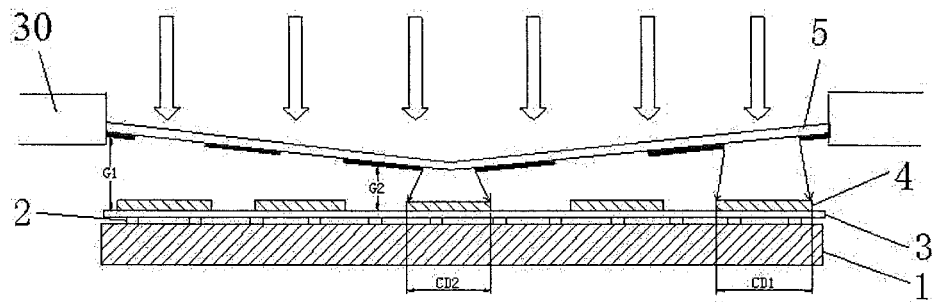
FIG. 1 is a schematic view of a proximity exposure apparatus in the prior art.

1: substrate stage; 2: supporting leg; 20: supporting table; 3: substrate; 4: photo resist; 5: mask; 30: supporter.

DETAILED DESCRIPTION OF PREFERRED EMBODIMENTS OF THE INVENTION

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
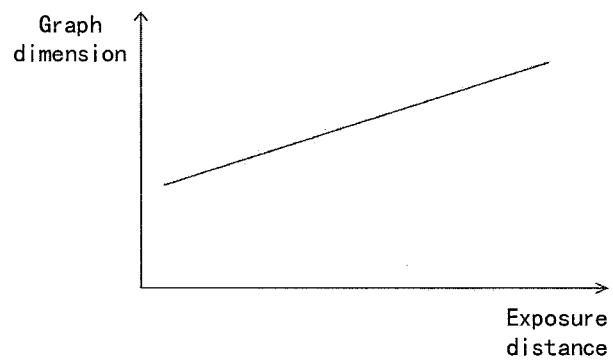
FIG. 2 is a graph showing a relationship between the graph dimension and the exposure distance in the proximity exposure.

In typical large dimensional proximity exposure technique, the dimension of a graph formed by exposure on the substrate decreases as the exposure distance decreases, as illustrated in FIG. 2. Thus, the bending of the mask can cause non-uniformity of the graph dimension at various positions on the substrate to degrade the quality of display products. The present disclosure provides an improved large dimensional proximity exposure apparatus which can adjust a substrate stage structure holding the substrate to be exposed in the exposure apparatus. In this way, after the substrate to be exposed is held on the substrate stage, the substrate to be exposed will be bent to some extent and its bending degree is identical to the bending degree of the mask on the mask supporter such that the exposure distance between the mask and the substrate to be exposed may be constant at all of positions. Thus, the graph dimensions formed by exposure at all of positions on the substrate are identical, thereby improving the quality of display products.

In accordance with a general concept of the present invention, it provides an exposure apparatus comprising: a substrate stage on which a holding region is provided to hold a substrate to be exposed, the holding region being provided with a support portion thereon for supporting the substrate to be exposed; a supporter configured to support a mask; a light source system configured to provide an exposure light which is illuminated on the substrate to be exposed via the mask to reproduce a pattern of the mask onto the substrate, wherein the support portion has a height which decreases gradually from an outer periphery of the holding region to a center of the holding region, such that the exposure distance is constant at all of positions on the holding region.

Figure 3:
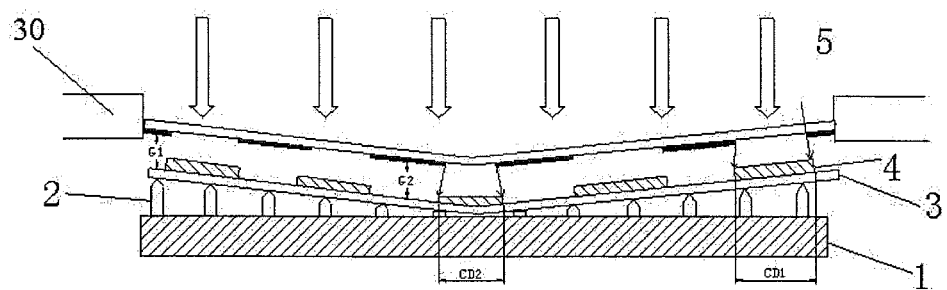
FIG. 3 is a schematic view of a proximity exposure apparatus according to an embodiment of the present invention.

In an example, an exposure apparatus is provided, as schematically shown in FIG. 3. The exposure apparatus comprises: a substrate stage 1 on which a holding region is provided to hold a substrate to be exposed, the holding region being provided with a support portion thereon for supporting the substrate 3 to be exposed; a supporter 30 configured to support a mask 5; a light source system configured to provide an exposure light which is illuminated on the substrate 3 to be exposed via the mask 5 to reproduce a pattern of the mask 5 onto the substrate 3, wherein the support portion has a height which decreases gradually from an outer periphery of the holding region to a center of the holding region, such that the exposure distance is constant at all of positions on the holding region.

As an example, if the substrate to be exposed has the same dimension as that of the mask for exposure, only one area to be exposed will be provided on the substrate stage; otherwise, if the substrate to be exposed has a larger dimension than that of the mask for exposure, the substrate to be exposed will be divided into more than one areas to be exposed on basis of the dimension of the mask for exposure, so as to perform a stitching exposure. Correspondingly, more than one holding regions for holding the substrate to be exposed will be provided on the substrate stage.

As an example, in order to reduce the influence of the support portion to local temperature and stress on the substrate 3 after it contacts with the substrate 3, the support portion may be arranged as supporting legs 2 spaced to each other on the substrate stage 1. The supporting legs 2 include fixed parts and adjustable parts provided onto the fixed parts. The fixed parts may for example use fixed legs provided on the conventional exposure apparatus to reduce the production costs of the exposure apparatus. The adjustable parts may be support structures which are added depending on the bending degree of the mask used. All of fixed parts have a same height such that tops of the fixed parts are in the same horizontal plane. However, all of the adjustable parts do not have a same height such that the distances between the mask and the tops of the adjustable parts are identical at all of positions on the top of the adjustable parts.

As an example, the specific height $H_N$ of the supporting legs 2 depends on the bending degree of the mask mounted on the supporter in the exposure apparatus, for example, the height $H_N$ of the supporting legs 2 meets:

$$H_N = H_O + \Delta h, \quad \Delta h = H[1-(l/L)^n]$$

wherein $H_O$ is the height of the fixed parts, $\Delta h$ is the height of the adjustable parts, i.e., the variation of the exposure distance caused by the bending of the mask, l is the distance between a point on the mask and the central point of the mask, L is the distance between the central point and an edge of the mask at a line connecting the point on the mask and the central point of the mask, H is the maximum variation of the exposure distance caused by the bending of the mask, which may be measured in practice, and n is a deformation index, $n>1$. The deformation index n is determined by both the dimension of the mask and the mask supporter of the exposure apparatus and may be calculated out by simulation based on actual bending degree of the mask.

As an example, on basis of the above structure design, when a large dimensional proximity exposure apparatus is used, the heights of the adjustable parts of the supporting legs may be determined by the following process:

At first, the bending degree of the mask in the exposure apparatus is determined.

For the mask in the large dimensional proximity exposure apparatus, when the mask is held on the mask supporter of the exposure apparatus, the variations $\Delta h$ of the exposure distances caused by the bending at various positions should meet: $\Delta h = H[1-(l/L)^n]$. These parameters have been defined as above.

Then, the heights of the supporting legs on the substrate stage are adjusted.

Based on the bending state of the mask in the exposure apparatus, the heights of the supporting legs on the substrate stage are adjusted such that the bending degree of the substrate to be exposed on the substrate stage is identical to that of the mask. The heights of the supporting legs should meet: $H_N = H_O + \Delta h$. These parameters have been defined as above.

Depending on the substrate stage design of the proximity exposure apparatus in accordance with an embodiment of the present invention, the heights of the supporting legs 2 at the central part of the holding region for the substrate to be exposed on the substrate stage 1 are adjusted to be below the heights of the supporting legs 2 at the edge part thereof on the basis of the bending degree of the mask, such that the bending degree of the substrate 3 to be exposed on the substrate stage 1 is identical to that of the mask 5. It ensures that the exposure distance between the central part of the substrate 3 to be exposed and the mask 5 is identical to the exposure distance between the edge part of the substrate 3 to be exposed and mask 5 (G1=G2). In this way, the graph dimension formed by exposing the photo resist material on the central part of the substrate 3 is identical to the graph dimension formed by exposing the photo resist material on the edge part of the substrate 3 (CD2=CD1), as shown in FIG. 3. In this way, the quality of the display products may be improved, and it may also prevent foreign matters from scratching the mask as the central part of the mask is too close to the substrate after the mask bends.

Figure 4:
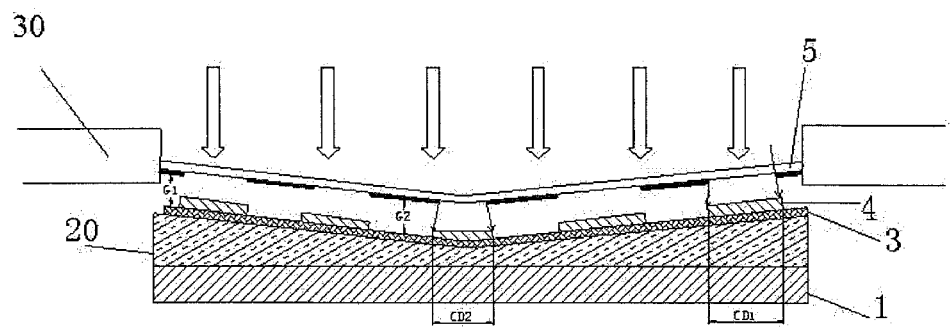
FIG. 4 is a schematic view of a proximity exposure apparatus according to another embodiment of the present invention.

In an example, with reference to FIG. 4, the exposure apparatus is similar to that shown in FIG. 3. However, in the example, the exposure apparatus is provided with a supporting table 20, which corresponds to each holding region for holding the substrate to be exposed on the substrate stage 1, for supporting the substrate 3 to be exposed. The supporting table 20 has an upper surface which is a continuous surface. Supporting and holding the substrate 3 to be exposed using the supporting table 20, may avoid the effects of stress concentration and non-uniformity in surface temperature of the substrate to be exposed. In this way, the substrate will have a better effect after being exposed and the quality of the substrate will be improved.

As an example, the supporting table 20 may also be divided into a fixed part and an adjustable part arranged onto the fixed part. For example, tops of the fixed part are in the same horizontal plane, and the distance between the mask and the top of the adjustable part is constant at all of positions on the top of the adjustable part. As an example, the height $H_N$ of the support portion meets:

$$H_N = H_O \Delta h, \Delta h = H[1-(l/L)^n]$$

wherein $H_O$ is the height of the fixed part, $\Delta h$ is the height of the adjustable part, i.e., the variation of the exposure distance caused by the bending of the mask, l is the distance between a point on the mask and the central point of the mask, L is the distance between the central point and an edge of the mask at a line connecting the point on the mask and the central point of the mask, H is the maximum variation of the exposure distance caused by the bending of the mask, and n is a deformation index. The selection of these parameters has been described in the above paragraphs. Therefore, the specific description thereof will be omitted below.

All of components in the figures of the present application are only illustrative, for example, the supporter 30 may be implemented by any devices for supporting the mask known in the art.

Furthermore, on basis of the exposure apparatus in any of the above embodiments, the present disclosure also provides an exposure system including a mask and the exposure apparatus as described in any of the above embodiments.

From the above embodiments, it can be seen that, adjusting the height of the support portion on the substrate stage of the large dimensional proximity exposure apparatus, the embodiments of the present invention achieve the substrate to be exposed which has a bending degree identical to that of the mask such that the exposure distance is constant at various positions on the substrate to be exposed. In this way, the problem that the graph dimension is not uniform as the exposure distance is non-uniform due to bending of the mask in exposure may be avoided and the risk of the mask being scratched by foreign matters at the central part on the substrate to be exposed may be reduced.

Although several exemplary embodiments have been shown and described, the present invention is not limited to those and it would be appreciated by those skilled in the art that various changes or modifications may be made in these embodiments without departing from the principles and spirit of the disclosure. These changes or modifications will fall within the scope of the present invention. The scope of the present invention is defined in the claims and their equivalents.

What is claimed is:

1. An exposure apparatus, comprising:
   a substrate stage on which a holding region is provided to hold a substrate to be exposed, the holding region being provided thereon with a support portion for supporting the substrate to be exposed;
   a supporter configured to support a mask;
   a light source system configured to provide an exposure light which is illuminated on the substrate to be exposed via the mask to reproduce a pattern of the mask onto the substrate;
   wherein the support portion has a height which decreases gradually from an outer periphery of the holding region to a center of the holding region, such that an exposure distance is constant at all of positions on the holding region;
   wherein the support portion comprises fixed parts and adjustable parts arranged onto the fixed parts, tops of the fixed parts being in the same horizontal place, the distances between the mask and the tops of the adjustable parts being constant at all of positions on the tops of the adjustable parts; and
   wherein the height $H_N$ of the support portion meets:

$$H_N = H_O + \Delta h, \Delta h = H[1-(l/L)^n]$$

wherein $H_O$ is the height of the fixed parts, $\Delta h$ is the height of the adjustable parts, i.e., the variation of the exposure distance caused by bending of the mask, l is the distance between a point on the mask and a central point of the mask, L is the distance between the central point and an edge of the mask along a line connecting the point on the mask and the central point of the mask, H is the maximum variation of the exposure distance caused by bending of the mask, and n is a deformation index which is greater than 1 and determined by both the dimension of the mask and the mask supporter of the exposure apparatus.

2. The exposure apparatus according to claim 1, wherein the support portion comprises supporting legs spaced to each other and arranged on the holding region of the substrate stage.

3. The exposure apparatus according to claim 2, wherein the support portion comprises a plurality of rows of supporting legs that are uniformly spaced to each other.

4. The exposure apparatus according to claim 1, wherein the support portion comprises a supporting table which has an upper surface, the upper surface being a continuous surface.

5. The exposure apparatus according to claim 1, wherein the support portion comprises at least one holding region.

6. An exposure system, comprising a mask and an exposure apparatus, the exposure apparatus comprising:
   a substrate stage on which a holding region is provided to hold a substrate to be exposed, the holding region being provided thereon with a support portion for supporting the substrate to be exposed;
   a supporter configured to support a mask;
   a light source system configured to provide an exposure light which is illuminated on the substrate to be exposed via the mask to reproduce a pattern of the mask onto the substrate;
   wherein the support portion has a height which decreases gradually from an outer periphery of the holding region to a center of the holding region, such that an exposure distance is constant at all of positions on the holding region;
   wherein the support portion comprises fixed parts and adjustable parts arranged onto the fixed parts, tops of the fixed parts being in the same horizontal plane, the distances between the mask and the tops of the adjustable parts being constant at all of positions on the top of the adjustable parts; and
   wherein the height $H_N$ of the support portion meets:

$$H_N = H_O + \Delta h, \Delta h = H[1-(l/L)^n]$$

wherein $H_O$ is the height of the fixed parts, $\Delta h$ is the height of the adjustable parts, i.e., the variation of the exposure distance caused by bending of the mask, l is the distance between a point on the mask and a central point of the mask, L is the distance between the central point and an edge of the mask along a line connecting the point on the mask and the central point of the mask, H is the maximum variation of the exposure distance caused by bending of the mask, and n is a deformation index which is greater than 1 and determined by both the dimension of the mask and the mask supporter of the exposure apparatus.

* * * * *